(12) United States Patent
Hsien

(10) Patent No.: US 6,655,449 B1
(45) Date of Patent: Dec. 2, 2003

(54) HEAT DISSIPATION DEVICE BY LIQUID COOLING

(76) Inventor: Cho-Chang Hsien, 3F, No. 877, Chung Cheng Rd., Hsinchuang City, Taipei Hsien (TW)

( * ) Notice: Subject to any disclaimer, the term of this patent is extended or adjusted under 35 U.S.C. 154(b) by 0 days.

(21) Appl. No.: 10/290,145

(22) Filed: Nov. 8, 2002

(51) Int. Cl.⁷ .................................................. H05K 7/20
(52) U.S. Cl. ...................... 165/80.4; 165/170; 361/799; 257/714
(58) Field of Search ............................... 165/80.4, 168, 165/170; 361/699; 257/714

(56) References Cited

U.S. PATENT DOCUMENTS

| | | | | |
|---|---|---|---|---|
| 3,406,753 A | * | 10/1968 | Habdas ........................ | 165/185 |
| 4,292,647 A | * | 9/1981 | Lee ............................. | 257/713 |
| 5,666,269 A | * | 9/1997 | Romero et al. ............. | 361/699 |
| 5,915,463 A | * | 6/1999 | Romero et al. ............. | 165/80.3 |
| 5,978,220 A | * | 11/1999 | Frey et al. .................. | 361/699 |
| 6,457,514 B1 | * | 10/2002 | Fumi .......................... | 165/80.4 |
| 6,578,626 B1 | * | 6/2003 | Calaman et al. ........... | 165/80.4 |

OTHER PUBLICATIONS

IBM TDB No. 92–5387, "Submerged Heatsink Component Cooling", May 1992, vol. 34 No. 12 pps. 387–388.*

* cited by examiner

Primary Examiner—Allen Flanigan
(74) Attorney, Agent, or Firm—Browdy and Neimark, P.L.L.C.

(57) ABSTRACT

A heat dissipation device by liquid cooling includes a casing, which has a spacing wall to form a channel therein. The casing has sidewalls and the inner surfaces of the sidewalls and the surface of the spacing wall are provided with a plurality of first toothed projections. An upper cover covers the casing and includes a liquid outlet and a liquid inlet at locations respectively corresponding to two corners of the channel. A plurality of posts are alternately placed inside the channel and a surface of each post is provided with a plurality of second toothed projections. Thereby, a liquid flowing inside the channel of the casing strikes the first and second toothed projections to promote flowing turbulence and increase heat transfer surface areas for heat dissipation.

10 Claims, 6 Drawing Sheets

HEAT DISSIPATION DEVICE BY LIQUID COOLING

BACKGROUND OF THE INVENTION

1. Field of the Invention

The invention relates to a heat dissipation device by liquid cooling. More specifically, the invention relates to a heat dissipation device that is used for a CPU or IC chipset, and provides an improved heat dissipation.

2. Description of the Related Art

In accordance with the heat dissipating device known in the prior art, it comprises an approximately cuboid frame having first and second pairs of opposite sidewalls. A plurality of electric parts are mounted on the frame. A motherboard is further mounted on the frame. The motherboard has a plurality of slots in one of which a processor board is inserted, the processor board mounting a chip irradiating heat thereon. A power supply is mounted inside the frame, wherein one side of the power supply is proximate to one of the first sidewalls and the other side proximate to one of the second sidewalls. A fan is further mounted proximate to the power supply. A heat transfer assembly for dissipating the heat generated from the chip is further usually mounted in the heat dissipating device.

The heat transfer assembly conventionally comprises a heat transmission plate, mounted at a bottom of the chip. The heat transmission plate includes a first cooling liquid inlet, a first cooling liquid outlet, and a channel through which the cooling liquid flows from the inlet to the outlet. A gas/liquid exchanger of the heat transfer assembly is further usually mounted inside the frame proximate to the fan. The gas/liquid exchanger has a second cooling liquid inlet connected to the first cooling liquid outlet, and a second cooling liquid outlet which forms a fluid channel together with a plurality of spaced-apart cooling liquid channels. The cooling liquid channels receive an air flow generated by the fan to reduce the temperature of the cooling liquid that flows from the second inlet through the channel to the second outlet.

Furthermore, a pump is mounted on the frame. The pump has a low pressure inlet and a high pressure outlet. The low pressure inlet is connected to the second outlet of the gas/liquid heat exchanger. The high pressure outlet is connected to the second inlet of the heat transmission plate.

With the above construction, the conventional heat dissipating device achieves heat dissipation by circulating the cooling liquid in the channel. However, since the cooling liquid flows are in a channel that is flat, turbulence effect of the cooling liquid is not optimized and thus the performance of heat transfer is very slow.

SUMMARY OF THE INVENTION.

It is therefore a principal object of the invention to provide a heat dissipation device by liquid cooling that can increase the surface area of heat transfer, the area of the channel, shorten the length of the channel, and reduce the meanders of liquid flowing inside the heat dissipating device. Thereby, flowing of a substantial amount of liquid is allowed, and the resistance to liquid flowing is reduced.

To accomplish the above and other objectives, a heat dissipation device by liquid cooling comprises a casing, inwardly including a spacing wall that forms a channel inside the casing. The casing has sidewalls, and the inner surfaces the sidewalls and the surface of the spacing wall are provided with a plurality of first toothed projections. An upper cover covers the casing and includes a liquid outlet and a liquid inlet at locations respectively corresponding to two corners of the channel. A plurality of posts are alternately placed inside the channel, a surface of each post being provided with a plurality of second toothed projections. Thereby, a liquid flowing inside the channel of the casing strikes the first and second toothed projections to promote flowing turbulence and increase heat transfer surface areas for heat dissipation.

In accordance with one aspect, the casing is a liquid container made of copper and the first toothed projections are formed by milling.

In accordance with another aspect, the posts are cylindrical copper posts and the second toothed projections are formed on an upper portion of the posts while a lower portion is provided with a pressing pattern. Before taking a brazing process, the lower portions of the posts are tightly inserted in the bottom of the casing via punching.

Furthermore, in accordance with another aspect, the posts are formed inside the channel of the casing in a single body. The shape of the posts matches with the liquid flowing directions and are adequately varied according to the respective locations of the posts.

To provide a further understanding of the invention, the following detailed description illustrates embodiments and examples of the invention, this detailed description being provided only for illustration of the invention.

BRIEF DESCRIPTION OF THE DRAWINGS;

The drawings included herein provide a further understanding of the invention. A brief introduction of the drawings is as follows.

DETAILED DESCRIPTION OF THE EMBODIMENTS

Figure 1:
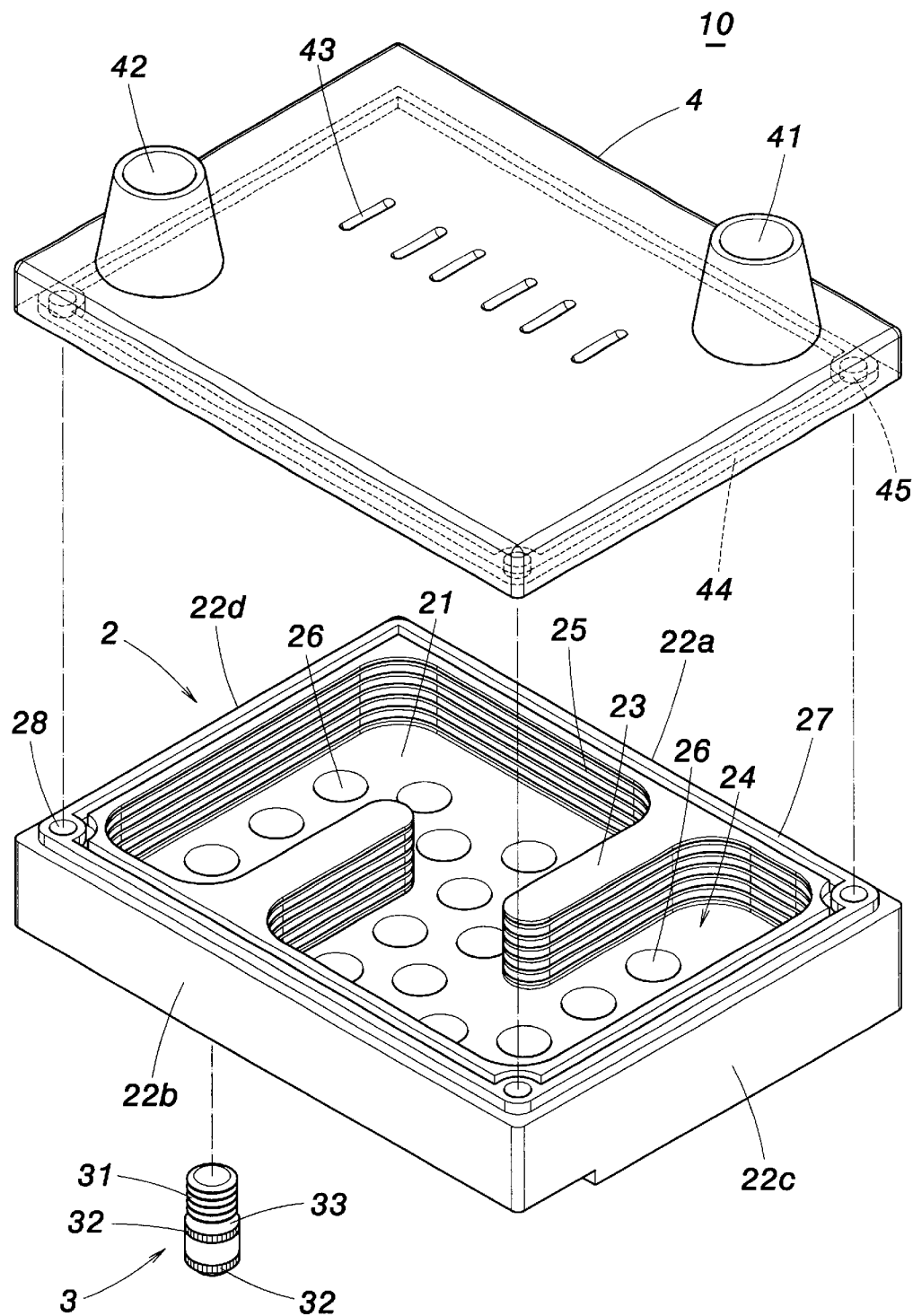
FIG. 1 is an exploded view of a heat dissipation device by liquid cooling according to an embodiment of the invention.

Wherever possible in the following description, like reference numerals will refer to like elements and parts unless otherwise illustrated.

Figure 6:
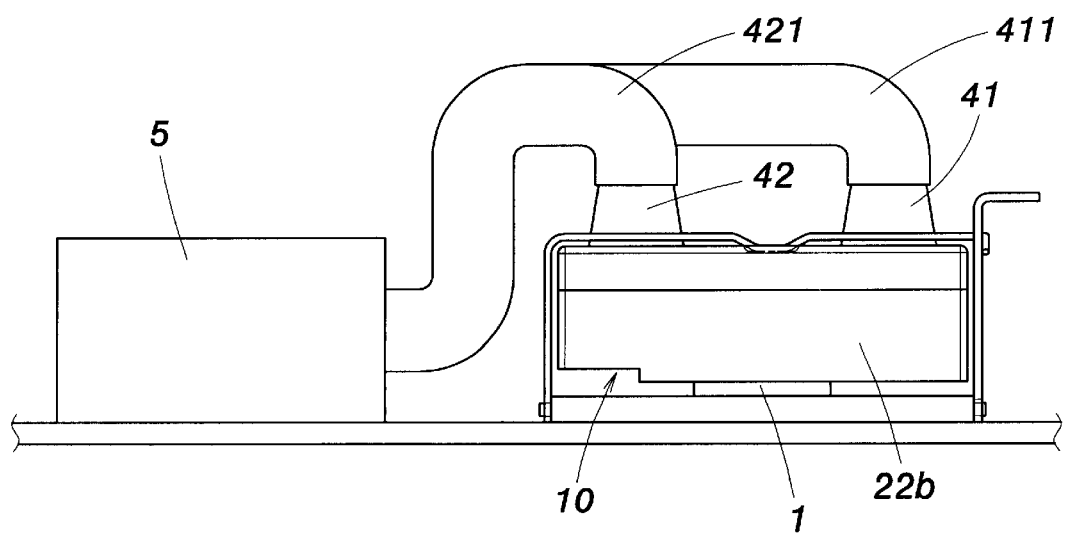
FIG. 6 is a schematic view illustrating the use of the heat dissipation device according to the embodiment of the invention.

Referring to FIG. 1, the invention provides a heat dissipation device 10 by liquid cooling that is used to dissipate heat from a central processor unit 1 or chipset of a computer as shown in FIG. 6. The heat dissipation device 10 comprises a casing 2, forming a liquid container made of copper. The casing 2 includes a bottom 21 that is respectively connected to opposite sidewalls 22a, 22b and opposite sidewalls 22c, 22d in a single body. A central area of the casing 2 includes a spacing wall 23 that defines an S-shaped channel 24 inside the casing 2.

Furthermore, the sidewalls 22a, 22b, 22c, 22d respectively include striated inner surfaces where are formed toothed projections 25 by milling cutting. The bottom 21 of the casing 2, within the channel 24, is provided with a plurality of alternating through-holes 26. A protruding rib 27 runs on the top edge of the casing 2 and along the sidewalls 22a, 22b, 22c, 22d. At least three corners of the casing 2 on the protruding rib 27 are respectively provided with positioning holes 28.

A plurality of posts 3 are respectively inserted inside the through-holes 26. The posts 3 are, for example, copper-made cylindrical posts. An upper portion of each post 3 is provided with a lateral striated surface forming a plurality of toothed projections 31. A lower portion of each post 3 is provided with a pressing pattern 32 the outer radius of which is slightly greater than that of each corresponding through-hole 26. The upper and lower sides of each post 3 are mutually connected via a push/pull portion 33, and a bottom edge of each post 3 further formed with a inclined face 34 as shown in FIG. 4.

The top of the casing 2 is covered with an upper cover 4 that includes a liquid outlet 41 and liquid inlet 42 at locations respectively corresponding to two corners of the channel 24. The liquid inlet 41 and the liquid inlet 42 are respectively connected to external pipes 411, 421 that, in turn, connect to a liquid tank 5 (see FIG. 6). A central area of the upper cover 4 includes a plurality of engagement positioning grooves 43. Furthermore, along a bottom peripheral surface of the upper cover 4 runs a snap-fitting slot 44 that snap-fits the protruding rib 27 on the top of the casing 2. The upper cover 4 further includes positioning posts 45 that respectively snap-fit with the positioning holes 28 to precisely attach the upper cover 4 to the casing 2.

Figure 2:
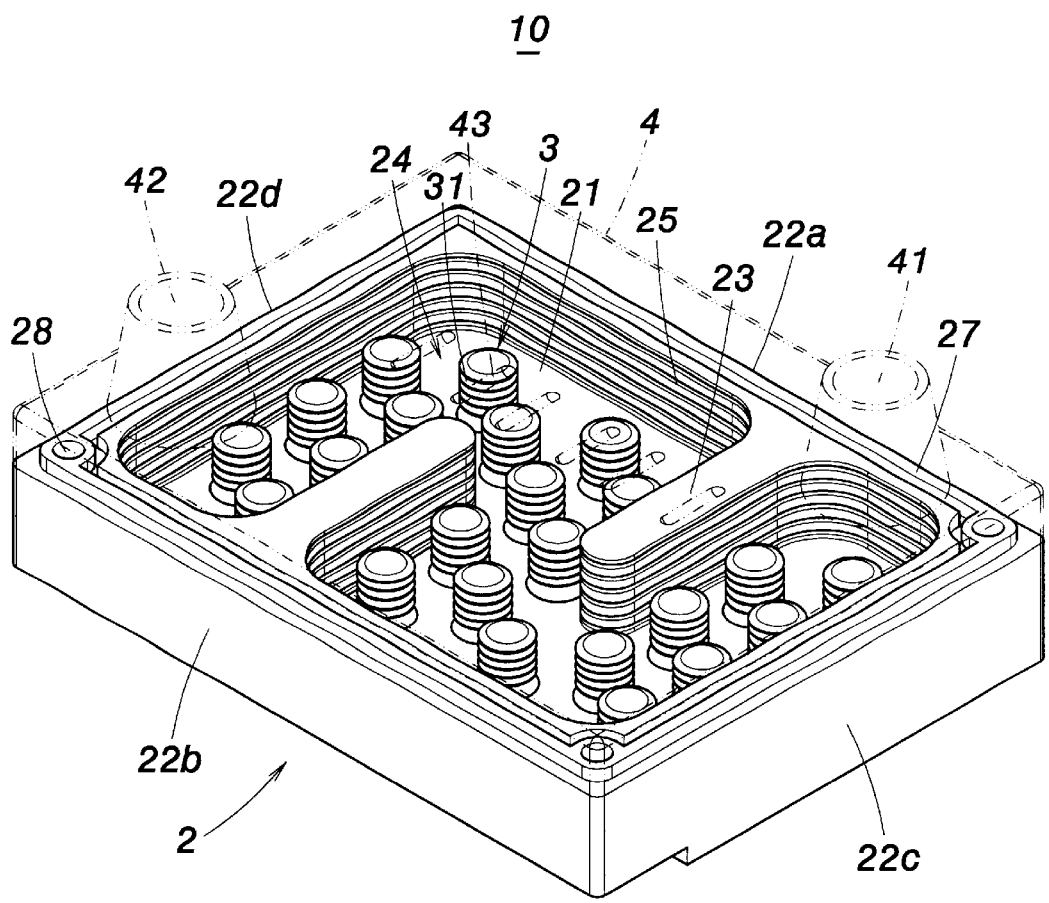
FIG. 2 is a perspective view illustrating the assembly of the heat dissipation device according to the embodiment of the invention.
Figure 4:
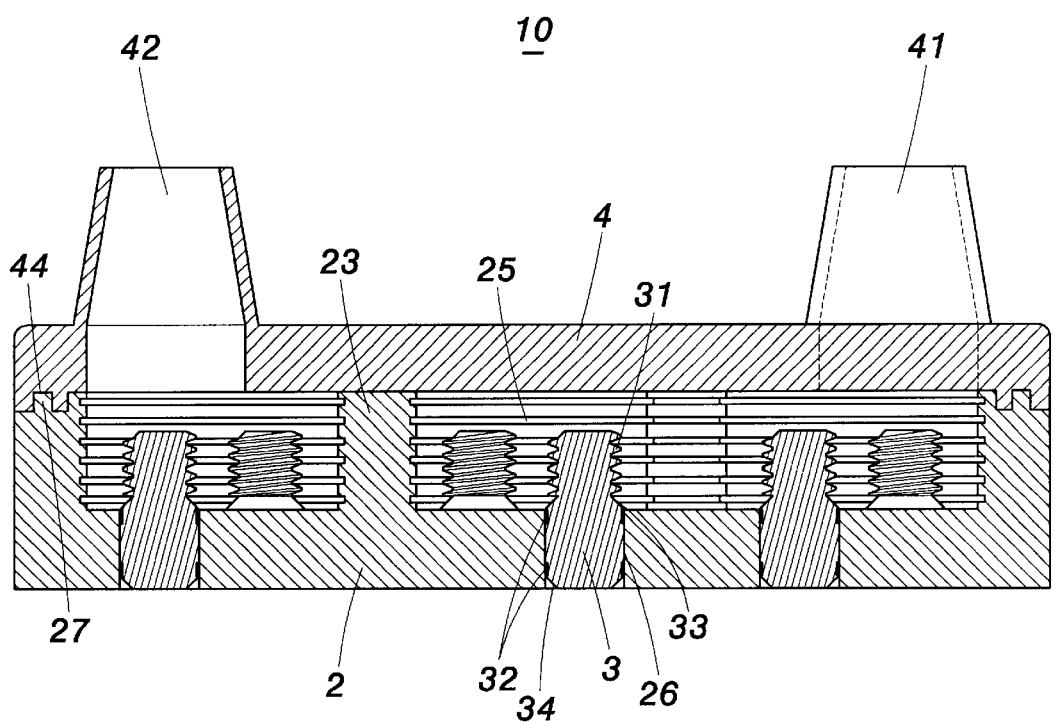
FIG. 4 is a sectional view illustrating the assembled heat dissipation device according to the embodiment of the invention.

Referring to FIG. 2 and FIG. 4, to assemble the embodiment of the invention, the posts 3 first are respectively mounted on the bottom 21 of the casing 2 via a punching process. The lower portions of the posts 3, provided with the pressing pattern 32, are entirely buried in the through-holes 26 so that the bottom of the posts 3 and that of the casing 2 are in a same plane. Then, hold the bottom 21 of the casing 2 in a turning upward position to fill the hollows formed by the inclined faces 34 with a copper soldering paste. Via brazing, copper fluid penetrates the gaps between the pressing pattern 32 and the through-hole 26 to fixedly solder the posts 3 to the bottom 21 of the casing 2. The upper portions of the posts 3 therefore lie inside the channel 24, while the lower portions are tightly buried inside the through-holes 26.

Figure 3:
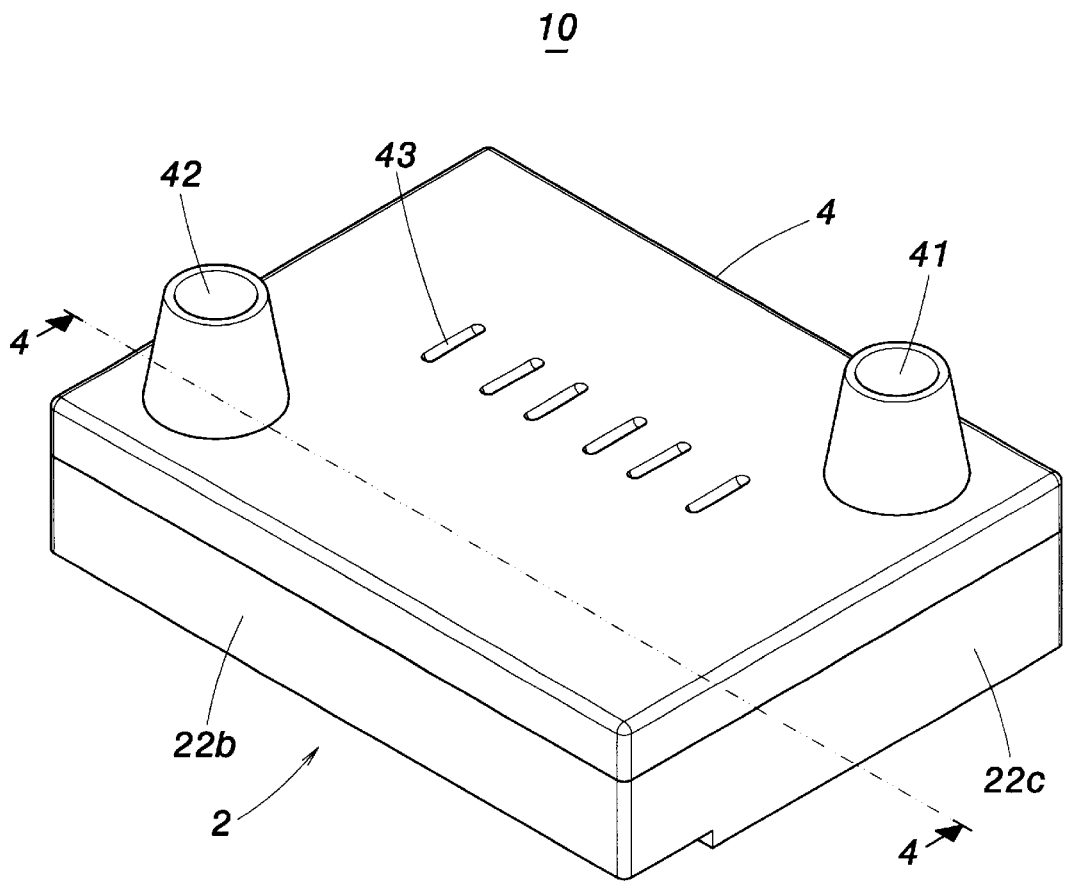
FIG. 3 is a perspective view particularly illustrating the assembly of the cover with the casing of the heat dissipation device according to the embodiment of the invention.

As illustrated in FIG. 1, the bottom 21 of the casing 2, to which the posts 3 are fixedly soldered, is turned downwardly. An isolation fill is laid in the snap-fitting slot 44 of the upper cover 4 that subsequently covers the top of the casing 2, with the positioning posts 45 of the upper cover 4 respectively engaging the positioning holes 28 of the casing 2. Via the positioning posts 45, aligned snap fitting of the protruding rib 27 with the snap-fitting slot 44 is thereby secured. Via baking, the isolation fill is solidified to complete the assembly of the heat dissipation device 10 as illustrated In FIG. 3.

Figure 5:
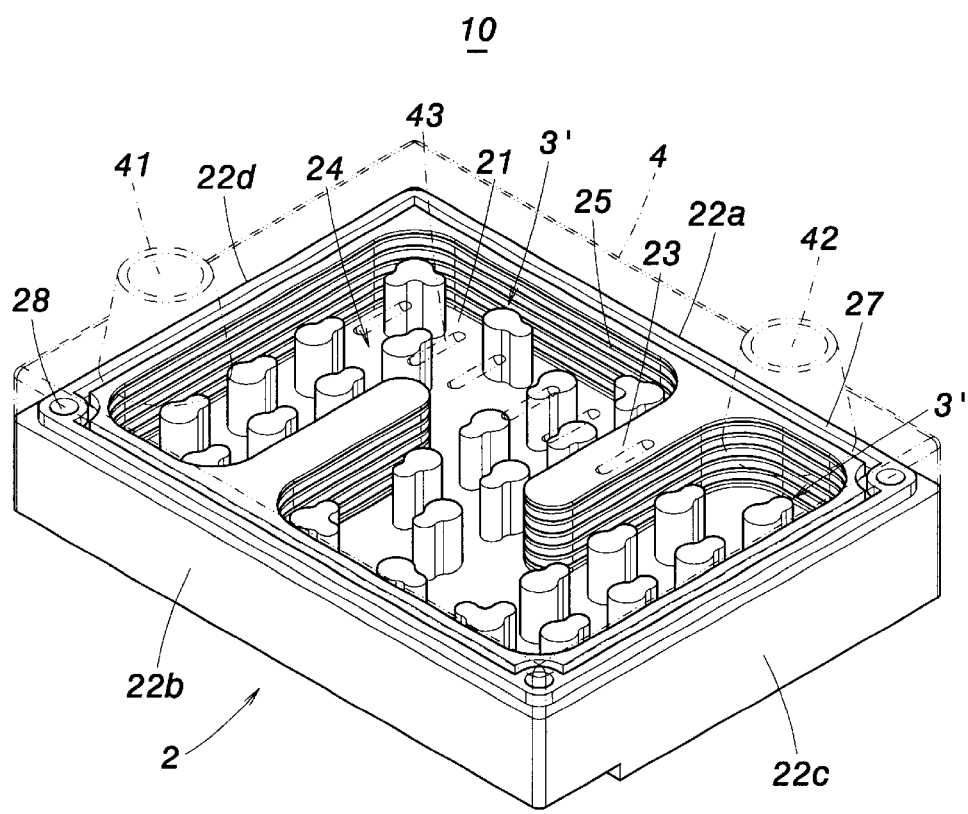
FIG. 5 is a perspective view illustrating a heat dissipation device according to another embodiment of the invention.

Referring to FIG. 5, a perspective view illustrates another embodiment of the invention. As illustrated, the posts 3' may be alternatively formed inside the channel 24 in a single body. The shape of the posts 3' preferably matches with the liquid flowing direction, and may be adequately varied according to the respective locations of the posts 3'. In this embodiment, the shape of the posts 3' may be, for example, narrow at one side and wide at another side in an approximate shape of calabash in order to reduce the resistance to liquid flow.

Referring to FIG. 6, a schematic view illustrates the use of the heat dissipation device 10 according to an embodiment of the invention. The liquid outlet pipe 411 and the liquid inlet pipe 421 respectively connect the liquid outlet 41 and the liquid inlet 42 to the liquid tank 5. The liquid tank 5 is further provided with a submersible motor (not shown) that is connected to the liquid inlet pipe 421. After it is ensured that a hermetic sealing of the liquid outlet and inlet pipes 411, 421 has been accomplished, the heat dissipation device 10 is placed vertically above the CPU 1. An adequate fastening element then is mounted in a manner to fasten by pressing through the engagement positioning grooves 43 of the upper cover 4, which therefore correctly position the heat dissipation device 10 on the CPU,1.

In operation to dissipate heat from the CPU 1, the liquid enclosed in the liquid, tank 5 flows through the liquid inlet pipe 421 into the casing 2. The liquid flows through the channel 24 and strikes the posts 3, 3'. By means of the toothed projections. 25, 31 formed on the sidewalls 22a, 22b, 22c, 22d, the spacing wall 23, and the posts 3, flow turbulence effect is increased to promote the heat transfer and heat dissipation.

By providing a larger cross-section area of the channel 24, shortening the length of the channel 24, and reducing the meanders inside the casing 2, the liquid resistance is therefore reduced. Those characteristics promote the flow of a substantial amount of liquid through the heat dissipation device 10, which contribute to a better heat transfer. The toothed projections 25, 31 further increase the surface area of heat transfer, which also advantageously promotes the heat dissipating performance.

Those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A heat dissipation device by liquid cooling, comprising:
   a casing having a spacing wall to forming a channel therein, the casing also having sidewalls, and inner surfaces of the side walls and a surface of the spacing wall being provided with a plurality of first toothed projections;
   an upper cover covering the casing and including a liquid outlet and a liquid inlet at locations respectively corresponding to two corners of the channel; and
   a plurality of posts, alternately placed inside the channel, a surface of each post being provided with a plurality of second toothed projections, thereby a liquid flow inside the channel of the casing strikes the first and second toothed projections to promote flowing turbulence and increase heat transfer surface areas for heat dissipation.

2. The device of claim 1, further connected to a liquid tank via pipes, and the heat dissipation device being placed on a central processor unit or an integrated circuit (IC) chipset.

3. The device of claim 1, wherein the casing is a liquid container made of copper and includes a bottom connected with the sidewalls in a single body, and the walls comprise two pairs of opposite sidewalls.

4. The device of claim 1, wherein the first toothed projections are formed by milling.

5. The device of claim 1, wherein a bottom of the casing within the channel includes a plurality of alternating through-holes into which the posts are inserted.

6. The device of claim 1, wherein the posts are cylindrical copper posts, the second toothed projections are formed on an upper portion of each post, a lower portion of each post includes a pressing pattern.

7. The device of claim 1, wherein a central area of the upper cover includes a plurality of engagement positioning grooves for an adequate fastening element to fasten thereon.

8. The device of claim 1, wherein a protruding rib is disposed on top edges of the sidewalls of the casing and a snap-fitting slot is formed along a peripheral of a bottom surface of the upper cover.

9. The device of claim 1, wherein the posts are formed inside the channel in a single body, the shape of the posts matches with the liquid flowing direction and is adequately varied according to the respective locations of the posts.

10. The device of claim 9, wherein the shape of the posts is narrow at one side and wide at another side in an approximate shape of calabash in order to reduce the resistance to liquid flowing.

* * * * *